United States Patent
Xie et al.

(10) Patent No.: US 10,290,544 B2
(45) Date of Patent: May 14, 2019

(54) METHODS OF FORMING CONDUCTIVE CONTACT STRUCTURES TO SEMICONDUCTOR DEVICES AND THE RESULTING STRUCTURES

(71) Applicant: GLOBALFOUNDRIES Inc., Grand Cayman (KY)

(72) Inventors: Ruilong Xie, Niskayuna, NY (US); Lars W. Liebmann, Mechanicville, NY (US); Daniel Chanemougame, Niskayuna, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/728,632

(22) Filed: Oct. 10, 2017

(65) Prior Publication Data
US 2019/0109045 A1    Apr. 11, 2019

(51) Int. Cl.
| | |
|---|---|
| *H01L 21/768* | (2006.01) |
| *H01L 21/8234* | (2006.01) |
| *H01L 23/522* | (2006.01) |
| *H01L 27/088* | (2006.01) |
| *H01L 29/06* | (2006.01) |
| *H01L 23/528* | (2006.01) |

(52) U.S. Cl.
CPC .. *H01L 21/76897* (2013.01); *H01L 21/76816* (2013.01); *H01L 21/823431* (2013.01); *H01L 21/823437* (2013.01); *H01L 21/823475* (2013.01); *H01L 21/823481* (2013.01); *H01L 23/528* (2013.01); *H01L 23/5226* (2013.01); *H01L 27/0886* (2013.01); *H01L 29/0653* (2013.01)

(58) Field of Classification Search
CPC ......... H01L 21/76897; H01L 21/76816; H01L 21/823431; H01L 21/823437; H01L 21/823475
See application file for complete search history.

(56) References Cited

U.S. PATENT DOCUMENTS

| | | | |
|---|---|---|---|
| 6,333,256 B2 | 12/2001 | Sandhu et al. | |
| 9,412,616 B1 * | 8/2016 | Xie | H01L 21/76224 |
| 9,553,028 B2 | 1/2017 | Xie et al. | |
| 9,570,442 B1 * | 2/2017 | Liu | H01L 27/0886 |

(Continued)

OTHER PUBLICATIONS

Joseph et al., "Advanced Plasma Etch for the 10nm node and Beyond," Proc. of SPIE, vol. 8685 86850A-1, 2013.

*Primary Examiner* — Bradley Smith
(74) *Attorney, Agent, or Firm* — Amerson Law Firm, PLLC

(57) ABSTRACT

One illustrative method disclosed herein may include forming a contact etching structure in a layer of insulating material positioned above first and second lower conductive structures, wherein at least a portion of the contact etching structure is positioned laterally between the first and second lower conductive structures, forming a first conductive line and a first conductive contact adjacent a first side of the contact etching structure and forming a second conductive line and a second conductive contact adjacent a second side of the contact etching structure, wherein a spacing between the first and second conductive lines is approximately equal to a dimension of the contact etching structure.

20 Claims, 12 Drawing Sheets

(56) References Cited

U.S. PATENT DOCUMENTS

| | | |
|---|---|---|
| 9,935,104 B1 * | 4/2018 | Wang .................. H01L 27/0886 |
| 2008/0179750 A1 | 7/2008 | Arnal et al. |
| 2011/0062502 A1 | 3/2011 | Yin et al. |
| 2012/0181692 A1 | 7/2012 | Heinrich et al. |
| 2012/0196432 A1 | 8/2012 | Yan |
| 2012/0261727 A1 | 10/2012 | Zhong et al. |
| 2018/0130711 A1 * | 5/2018 | Zang ............... H01L 21/823431 |

* cited by examiner

METHODS OF FORMING CONDUCTIVE CONTACT STRUCTURES TO SEMICONDUCTOR DEVICES AND THE RESULTING STRUCTURES

BACKGROUND OF THE INVENTION

1. Field of the Invention

The present disclosure generally relates to the fabrication of semiconductor devices, and, more particularly, to various novel methods of forming conductive contact structures to semiconductor devices and the resulting novel structures.

2. Description of the Related Art

Modern integrated circuit (IC) products include a very large number of active and passive semiconductor devices (i.e., circuit elements) that are formed on a very small area of a semiconductor substrate or chip. Active semiconductor devices include, for example, various types of transistors, e.g., field effect transistors (FETs), bi-polar transistors, etc. Examples of passive semiconductor devices include capacitors, resistors, etc. These semiconductor devices are arranged in various circuits that are part of various functional components of the IC product, e.g., a microprocessor (logic area), a memory array (memory area), an ASIC, etc. Like all electronic devices, semiconductor devices in an IC product need to be electrically connected through wiring so that they may operate as designed. In an IC product, such wiring is done through multiple metallization layers formed above a semiconductor substrate.

Typically, due to the large number of semiconductor devices (i.e., circuit elements) and the required complex layout of modern integrated circuits, the electrical connections or "wiring arrangement" for the individual semiconductor devices cannot be established within the same device level on which the semiconductor devices are manufactured. Accordingly, the various electrical connections that constitute the overall wiring pattern for the IC product are formed in a metallization system that comprises one or more additional stacked so-called "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures—so called device-level contacts (explained more fully below). In some more advanced devices, another metallization layer comprised of conductive lines (sometimes called the "M0" layer) is formed between the device level contacts and the V0 vias.

FIG. 1 is a cross-sectional view of an illustrative IC product 10 comprised of a transistor device 11 formed in and above a semiconductor substrate 12. Also depicted are a plurality of so-called "CA contact" structures 14 for establishing electrical connection to the simplistically depicted source/drain regions 20 of the device 11, and a gate contact structure 16, which is sometimes referred to as a "CB contact" structure. As shown in FIG. 1, the CB gate contact 16 is typically positioned vertically above isolation material 13 that surrounds the device 11, i.e., the CB gate contact 16 is typically not positioned above the active region defined in the substrate 12, but it may be in some advanced architectures.

The transistor 11 comprises an illustrative gate structure 22, i.e., a gate insulation layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1, layers of insulating material 30A, 30B, i.e., interlayer dielectric materials, have been formed above the substrate 12. Other layers of material, such as contact etch stop layers and the like, are not depicted in the drawing. Also depicted are illustrative raised epi source/drain regions 32 and source/drain contact structures 34, which typically include a so-called "trench silicide" (TS) structure 36. The CA contact structures 14 may be in the form of discrete contact elements, i.e., one or more individual contact plugs having a generally square-like shape or cylindrical shape when viewed from above, that are formed in an interlayer dielectric material. In other applications, the CA contact structures 14 may also be a line-type feature that contacts underlying line-type features, e.g., the TS structure 36 that contacts the source/drain region 20, and typically extends across the entire active region on the source/drain region 20 in a direction that is parallel to the gate width direction of the transistor 11, i.e., into and out of the plane of the drawing in FIG. 1. The CA contacts 14 and the CB contact 16 are all considered to be device-level contacts within the industry.

FIG. 1 depicts an illustrative example of an IC product 10 that includes a so-called M0 metallization layer of the multi-level metallization system for the product 10. The M0 metallization layer is formed in a layer of insulating material 46, e.g., a low-k insulating material, and it is formed to establish electrical connection to the device-level contacts— CA contacts 14 and the CB contact 16. Also depicted in FIG. 1 is the so-called M1 metallization layer for the product 10 that is formed in a layer of insulating material 38, e.g., a low-k insulating material. A plurality of conductive vias— so-called V0 vias 40—is provided to establish electrical connection between the M0 metallization layer and the M1 metallization layer. Both the M0 metallization layer and the M1 metallization layer typically include a plurality of metal lines 44, 42 (respectively) that are routed as needed across the product 10. The formation of the M0 metallization layer may be helpful in reducing the overall resistance of the circuits formed on the substrate 12. However, in some IC products, the M0 metallization layer may be omitted and the V0 vias 40 of the M1 metallization layer make contact with the CA contacts 14 and the CB contact 16.

The metallization lines, e.g., the lines 44, 42, are typically formed by forming long continuous trenches in their associated layer of insulating material across substantially the entire substrate. Thereafter, these metallization trenches are filled with one or more conductive materials and one or more chemical mechanical polishing (CMP) processes are performed to remove excessive conductive materials outside of the trench. The net result is, at this point in the typical process flow, the metallization lines are relatively long continuous structures that extend across the entire substrate. Ultimately, portions of the continuous metallization lines must be removed or "cut" to establish a functional wiring pattern for the integrated circuits, i.e., a single continuous metallization line may be cut into several smaller segments that are electrically isolated from one another so that each of these individual, small "post-cut" segments may be individually contacted by other components of the metallization system. However, cutting these continuous metallization lines into smaller segments can be a very challenging and time-consuming process that may lead to processing errors and adversely impact product yields.

The various transistor devices that are formed for an IC product must be electrically isolated from one another to properly function in an electrical circuit. Typically, this is accomplished by forming a trench in the substrate 12, and filling the trench with an insulating material, such as silicon dioxide. Within the industry, these isolation regions may sometimes be referred to as "diffusion breaks." FIG. 2 is a simplistic plan view of a portion of the IC product 10 wherein an illustrative single diffusion break (SDB) structure 50 separates two illustrative circuit structures 52 and 54 of the IC product from one another along the line 56. In one example, the section 52 may be a NAND2 circuit structure, while the section 54 may be a MUX circuit structure. Also depicted in FIG. 2 are a plurality of transistor structures comprised of a gate cap 24 and trench silicide regions 36 in the source/drain regions of the transistor devices. Various metal lines 60 are depicted in FIG. 2 as well.

As shown in the circled region 70, CA contact structures 14 (shown in dashed lines) have been formed to establish electrical connection to the source/drain regions of transistors on opposite sides of the SDB 50. To make the connection between the metal lines 60 and the underlying CA contact structures 14, there must be a tip-to-tip spacing 72 between the end of the respective metal lines 60. This is typically accomplished by performing lithography and etching processes to define separated trenches in a layer of insulating material (not shown) for the respective lines 60 and thereafter forming both the CA contact structures 14 and the metal lines 60 at the same time using a dual-damascene processing technique. Another typical requirement when making such connections is that the ends of the metal lines 60 need to overlap the CA contact structures 14 by a distance 74 to insure that there is sufficient contact area between the metal line 60 and the CA contact structures 14 such that the resistance of the overall contacting arrangement is not increased relative to what is anticipated by the design process. Typically, the CA source/drain contact structures 14 have to be contacted at a distance corresponding to the gate pitch of the gate structures of the various transistor devices to take advantage of the space savings achieved when an IC product includes an SDB isolation structure. The gate pitch of the transistors on modern IC products is currently very small and further reductions are anticipated as future products are developed. Unfortunately, directly patterning trenches for such metal lines 60 having such a tip-to-tip arrangement is very challenging given the very small dimensions of modern transistor devices, the increased packing densities of semiconductor devices on modern IC products and the very small and ever decreasing gate pitch of transistor devices on modern IC products. Also depicted in FIG. 2, in the circled region 80, is the formation of metal lines 60 that contact spaced-apart CB gate contact structures 16 that are formed to contact gate structures on different transistor devices. While the metal lines 60 that contact the gate contact structures 16 are also arranged in a tip-to-tip configuration, there is more spacing between the ends of the metal lines 60 in such a configuration. Nevertheless, the formation of these lines 60 to the desired dimensions and positions relative to the gate contact structures 16 is still a very challenging process that, if not done accurately, can lead to device failure.

The present disclosure is directed to various novel methods of forming conductive contact structures to semiconductor devices and the resulting novel structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming conductive contact structures to semiconductor devices and the resulting novel structures. One illustrative method disclosed herein may include forming a layer of insulating material comprising a first material above first and second lower conductive structures, and forming a contact etching structure in the layer of insulating material, wherein the contact etching structure comprises a second material that is different than the first material and wherein at least a portion of the contact etching structure is positioned laterally between at least a portion of the first lower conductive structure and at least a portion of the second lower conductive structure. In this example, the method also includes forming a first conductive line and a first conductive contact adjacent a first side of the contact etching structure, wherein the first conductive contact is conductively coupled to the first lower conductive structure, and forming a second conductive line and a second conductive contact adjacent a second side of the contact etching structure, wherein the second conductive contact is conductively coupled to the second lower conductive structure and wherein a spacing between the first and second conductive lines is approximately equal to a dimension of the contact etching structure.

BRIEF DESCRIPTION OF THE DRAWINGS

The disclosure may be understood by reference to the following description taken in conjunction with the accompanying drawings, in which like reference numerals identify like elements, and in which.

Figure 1:
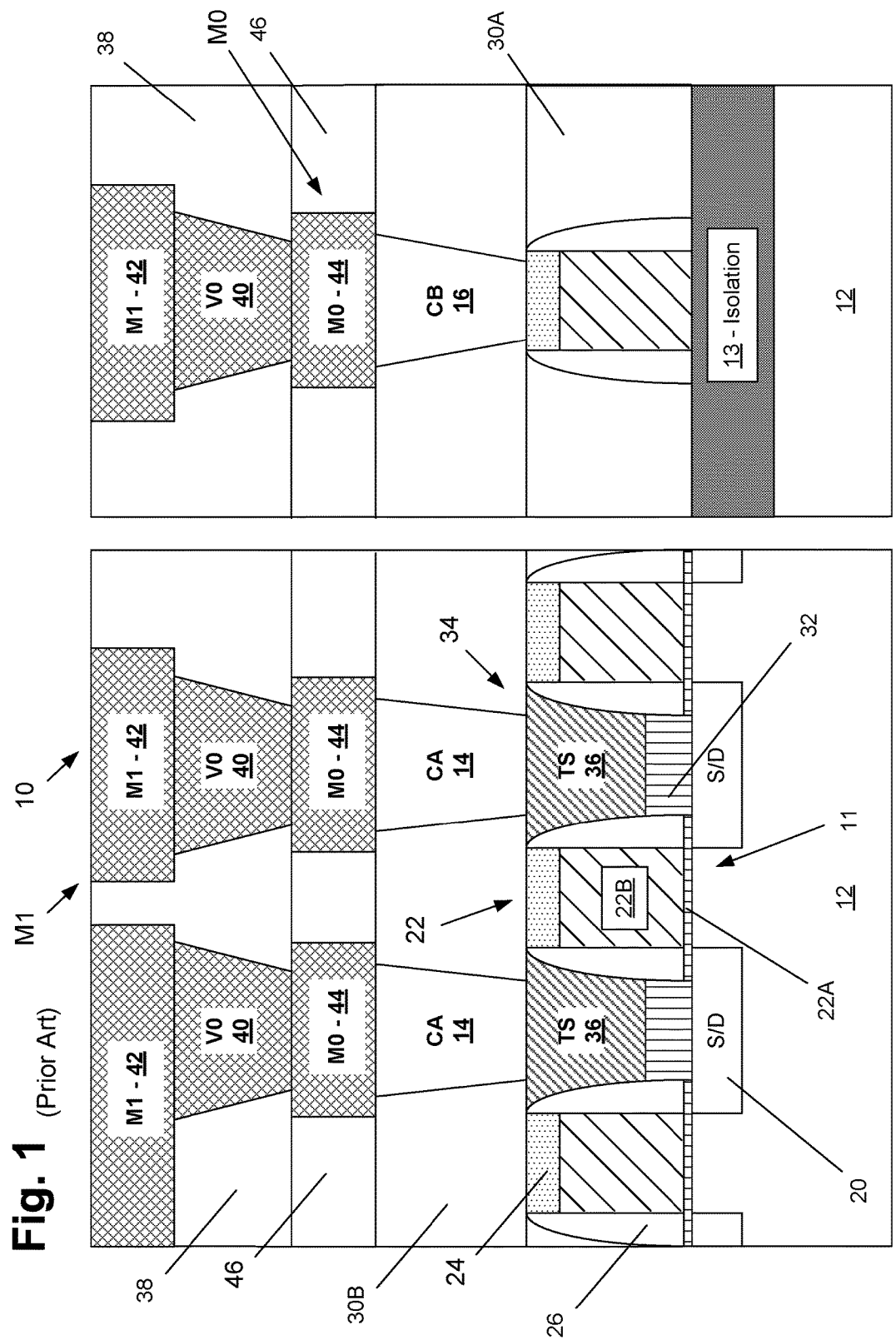
FIGS. 1 and 2 depict various illustrative prior art arrangements of device-level contacts and metallization layers for an integrated circuit product.
Figure 2:
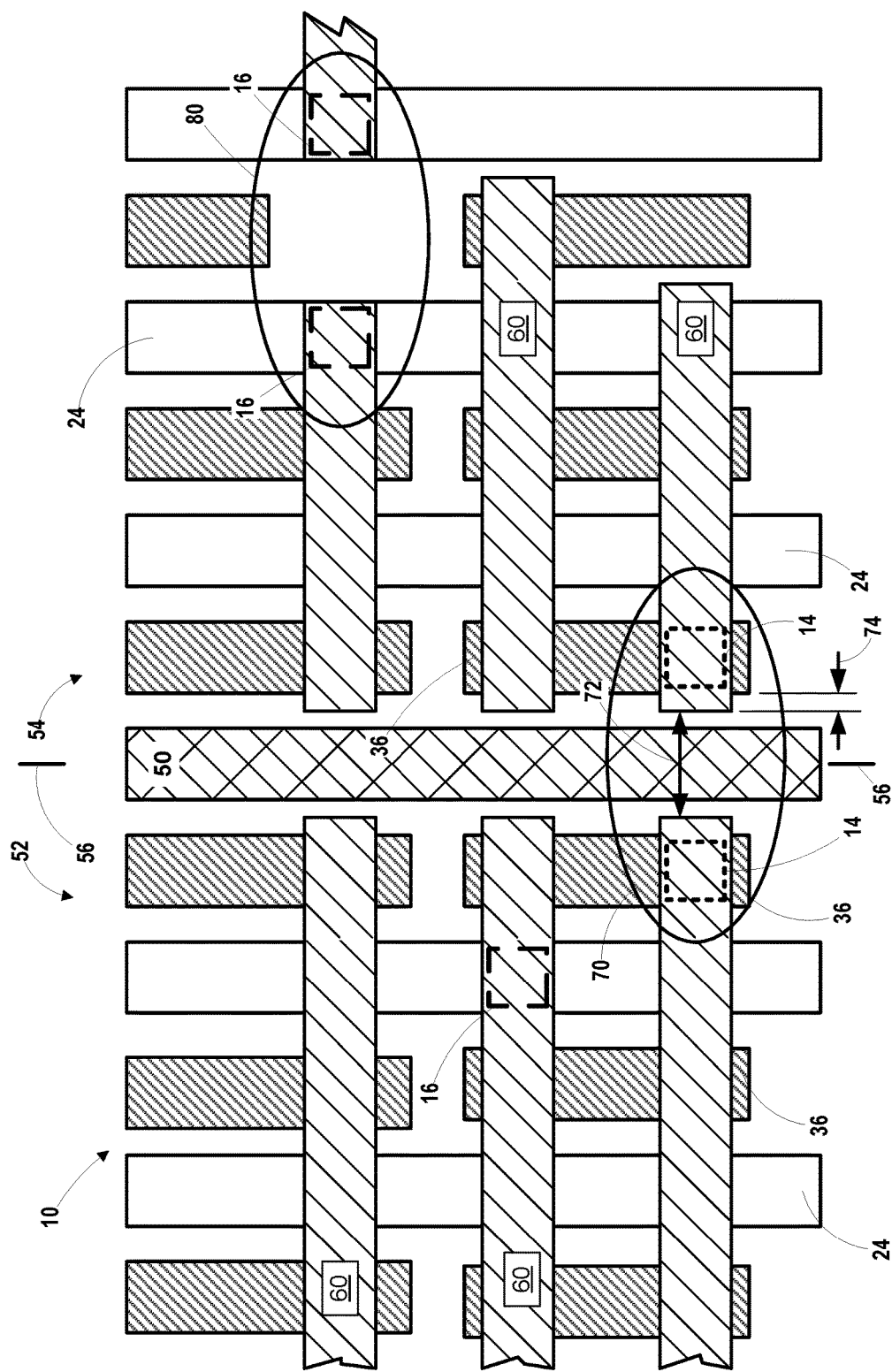

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming conductive contact structures to semiconductor devices and the resulting novel structures. The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, etc. As will be appreciated by those skilled in the art after a complete reading of the present application, the methods and devices disclosed herein may be employed in forming integrated circuit products using transistor devices in a variety of different configurations, e.g., planar devices, FinFET devices, etc. The gate structures of the transistor devices may be formed using either "gate first" or "replacement gate" manufacturing techniques. Thus, the presently disclosed subject matter should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail.

FIGS. 3-12 depict various novel methods of forming conductive contact structures to semiconductor devices on an integrated circuit (IC) product 100 and the resulting novel structures. As will be appreciated by those skilled in the art after a complete reading of the present application, a novel contact etching structure 180 is disclosed herein that may be used to form a variety of different conductive contact structures that are conductively coupled to a variety of different structures found on integrated circuit products. The present application specifically discusses only two illustrative examples of the novel gate contact etching structure 180 disclosed herein: a single diffusion break (SDB) isolation structure 142 and a gate contact etching post 143. Of course, the presently disclosed invention should not be considered to be limited to these two illustrative examples.

Figure 3:
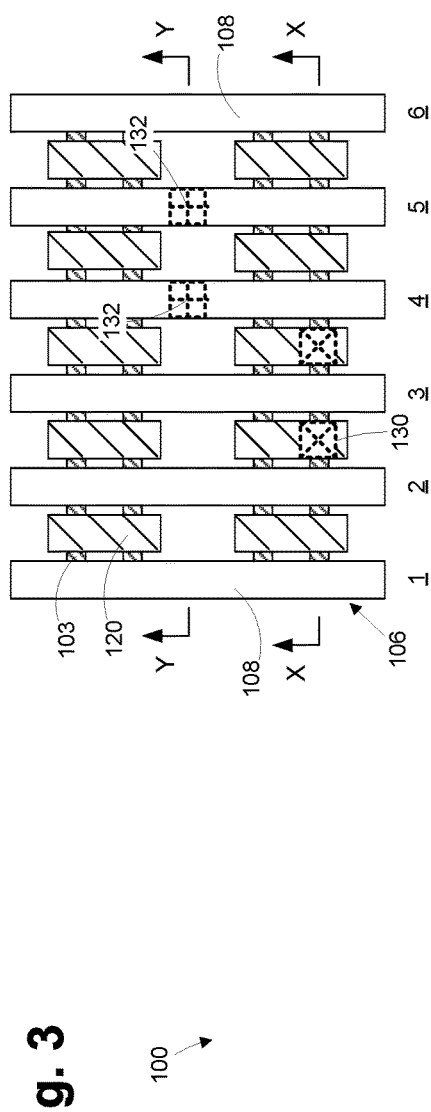
FIGS. 3-12 are drawings that depict various novel methods disclosed herein for forming conductive contact structures to semiconductor devices and the resulting novel device structures.
Figure 3:
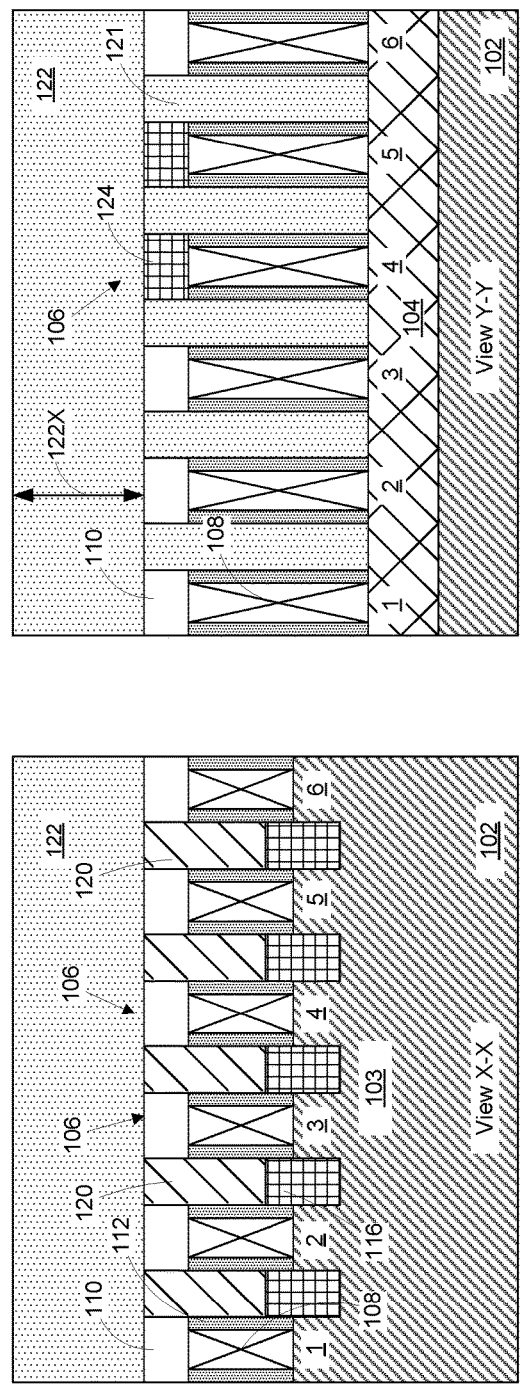

FIG. 3 includes a simplistic plan view of one illustrative embodiment of an IC product 100. The product 100 generally comprises a plurality of gates 106 (numbered 1-6 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices. A plurality of fins 103 have been formed in the substrate 102 using traditional manufacturing techniques, and the gates 106 have been formed across the fins 103. Also depicted in the plan view are illustrative source/drain contact structures 120 (e.g., trench silicide structures) that are conductively coupled to the source/drain regions of the transistor devices. As will be described more fully below, a single diffusion break (SDB) will be formed through gate number 3. The plan view also depicts (in dashed lines) where CA contact structures 130 will be formed to contact source/drain regions on opposite sides of what will become the SDB isolation region. Also shown in the plan view in FIG. 3 (in dashed lines) are the locations where CB gate contact structures 132 will be formed to contact the gate structures 108 of gates 4 and 5.

The drawings included herein also include two cross-sectional drawings ("X-X" and "Y-Y") that are taken where indicated in the plan view. More specifically, the cross-sectional view X-X is taken through the gates 106 in a gate-length direction of the transistor devices at a location where CA contact structures 130 will be formed. In the case where the transistor devices are FinFET devices, the view X-X should be understood to be a cross-sectional view taken through the long axis of a fin of the transistor in a direction that corresponds to the gate length (current transport) direction of a FinFET device. The cross-sectional view Y-Y is taken through the gates 106 in a gate-length direction of the transistor devices at a location where the CB gate contact structures 132 will be formed. The CB gate contact structures 132 are positioned vertically above isolation material 104. It should be noted that not all aspects of the processing operations shown in cross-sectional views X-X and Y-Y will be reflected in the associated plan view so as to not overly complicate the drawings and to facilitate a better understanding of the subject matter disclosed herein.

The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 3 depicts the IC product 100 after several process operations were performed. First, as noted above, the fins 103 were formed, and the gates 106 were formed above the fins 103. In the illustrative example depicted herein, the gates 106 of the transistor devices comprise gate structures 108 manufactured using well-known replacement gate manufacturing techniques. Each of the gates 106 includes a schematically depicted final gate structure 108, a gate cap 110 and a sidewall spacer 112. The sidewall spacers 112 and the gate caps 110 may be comprised of a variety of different materials, such as silicon nitride, SiNC, SiN, SiCO, and SiNOC, etc., and they may be made of the same or different materials. Typically, the materials for the gate structures 108 are sequentially formed in gate cavities between the spacer 112 after removal of a sacrificial gate electrode (not shown) and a sacrificial gate insulation layer (not shown). The gate structures 108 are typically comprised of a high-k gate insulation layer (not shown) such as, hafnium oxide, a material having a dielectric constant greater than 10, etc., and one or more conductive material layers that function as the gate electrode of the gate structure 108. For example, one or more work-function adjusting metal layers and a bulk conductive material may be deposited to form the gate electrode structure.

Still referencing FIG. 3, prior to the formation of the final gate structures 108, epi semiconductor material 116 was formed on the exposed portions of the active regions 103 (or fins in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawing. Also depicted are illustrative source/drain contact structures 120 which typically include a so-called "trench silicide" (TS) structure (not separately shown). As indicated, the upper surface of the source/drain contact structures 120 is typically approximately level with the upper surface of the gate caps 110.

After formation of the epi material 116, a layer of insulating material 121 (e.g., silicon dioxide) was blanket-deposited across the substrate. Thereafter a CMP process was performed to planarize the layer of insulating material 121 using the original gate caps (not shown) positioned above the sacrificial gate structures as a polish stop layer. At that point, traditional replacement gate manufacturing processes were performed to remove the original gate caps and the sacrificial gates structures and to form the final gate structure 108. At that point, the gate caps 110 were formed on the product 100. Next, portions of the insulating material 121 above the source/drain regions were removed and the above-referenced source/drain contact structures 120 were formed in the source/drain regions of the devices.

Also depicted in FIG. 3 are illustrative lower gate contact structures 124 that were formed so as to establish electrical contact to the gate structures 108 of the gates 4 and 5. The lower gate contact structures 124 are not depicted in the plan view in FIG. 3. The lower gate contact structures 124 may be formed by forming a patterned etch mask layer (not shown) above the gate caps 110 that selectively exposes portions of the gate caps 110 for the gates 4 and 5 where the lower gate contact structures 124 will be formed. Thereafter, an etching process was performed to remove the exposed potions of the gate caps 110 so as to expose a portion of the gate structures 108 for the gates 4 and 5. At that point, the patterned etch mask was removed and one or more conductive materials were deposited so as to contact the exposed portions of the gate structures 108. Thereafter, a CMP process was performed to remove excess conductive materials using the gate caps 110 and the layer of insulating material 121 as a polish stop layer. Thereafter, another layer of insulating material 122 (e.g., silicon dioxide) was blanket deposited across the product 100. An optional CMP process may be performed on the upper surface of the layer of insulating material 122 if desired. Note that no attempt will be made to show the layers of insulation material 122 or 121 in the plan views depicted herein so as not to overly complicate the drawings. As will be appreciated by those skilled in the art after a complete reading of the present application, in one illustrative embodiment, the thickness 122X of the layer of insulating material 122 is great enough to accommodate the vertical height of the final CA contact structures 130 (and CB contact structures 132) as well as the vertical thickness of the first or lowermost metal line layer (e.g., M0 or M1) of the metallization system formed for the product 100.

Figure 4:
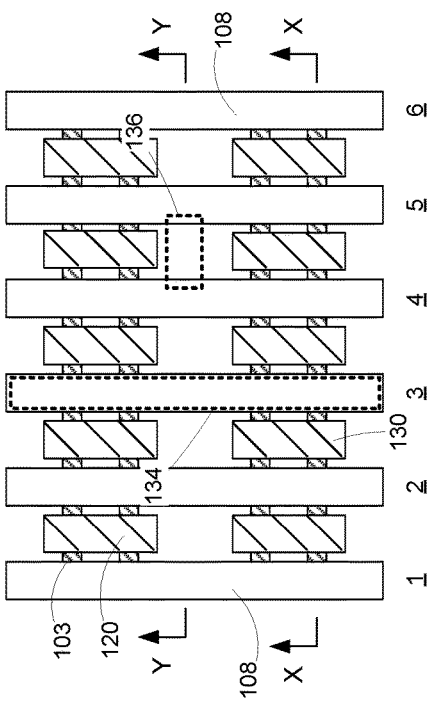
Figure 4:
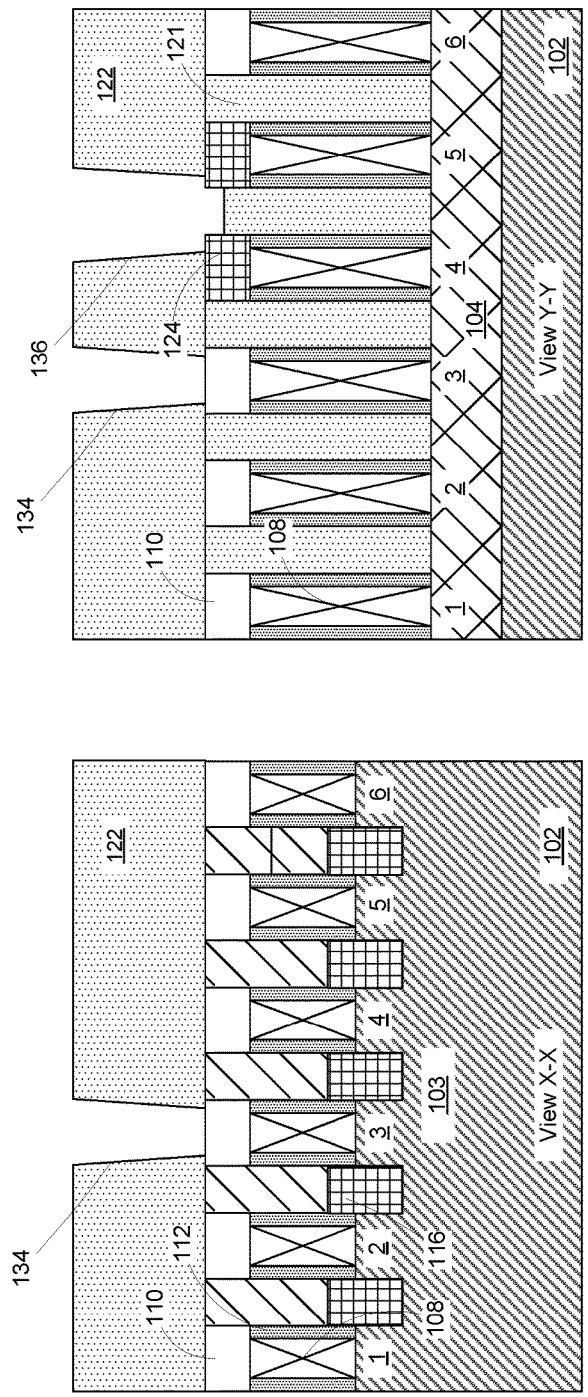

FIG. 4 depicts the IC product 100 after openings 134 and 136 were formed in the layer of insulating material 122. The openings 134 and 136 were formed by forming a patterned etch mask layer (not shown), e.g., photoresist, OPL, etc., above the product 100, and thereafter performing one or more etching processes through the patterned etch mask layer. FIG. 4 depicts the product 100 after the patterned mask layer has been removed. The opening 134 corresponds to the location where an SBD isolation region will be formed through the gate structure 108 of the gate 3, as described more fully below. The opening 136 corresponds to the location where a gate contact etching post or pillar, as well as two closely spaced (densely packed) gate contacts, will be formed, as described more fully below.

Figure 5:
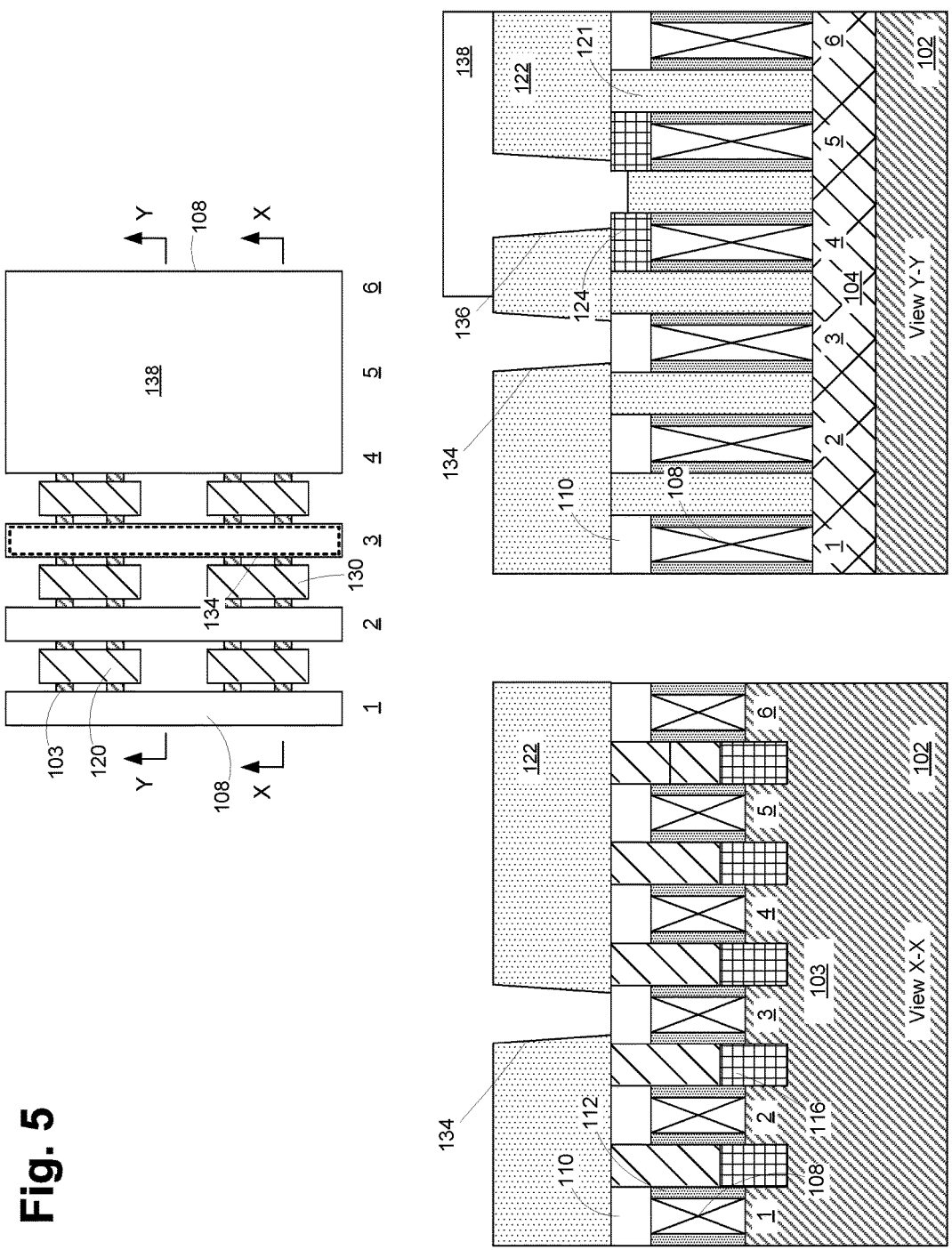

FIG. 5 depicts the product 100 after a blanket etch mask 138 (i.e., a block mask) was formed above the product 100. As depicted, the etch mask 138 fills the opening 136 but leaves the opening 134 exposed for further processing operations.

Figure 6:
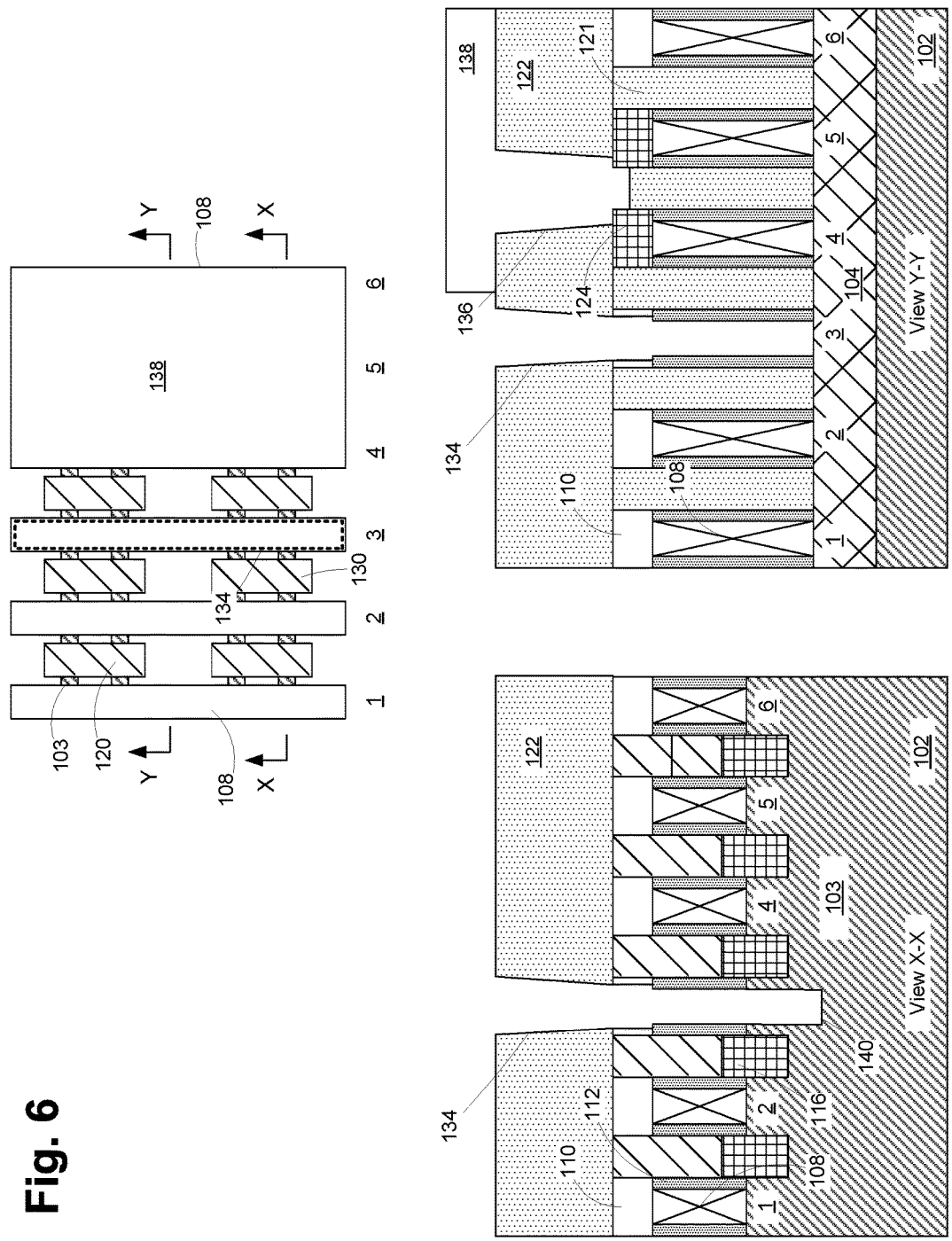

FIG. 6 depicts the product 100 after one or more etching processes were performed through the opening 134 in the layer of insulating material 122 so as to define a trench 140 in the substrate 102. As depicted, these etching processes remove a portion of the gate cap 110 and substantially all of the gate structure 108 for gate 3, as well as portions of the substrate 102. At the conclusion of these etching processes, a trench 140 is defined in the substrate 102. The depth of the trench 140 may vary depending upon the particular application, but the trench 140 should be formed deep enough such that insulation material formed therein may serve as an effective SDB isolation region.

Figure 7:
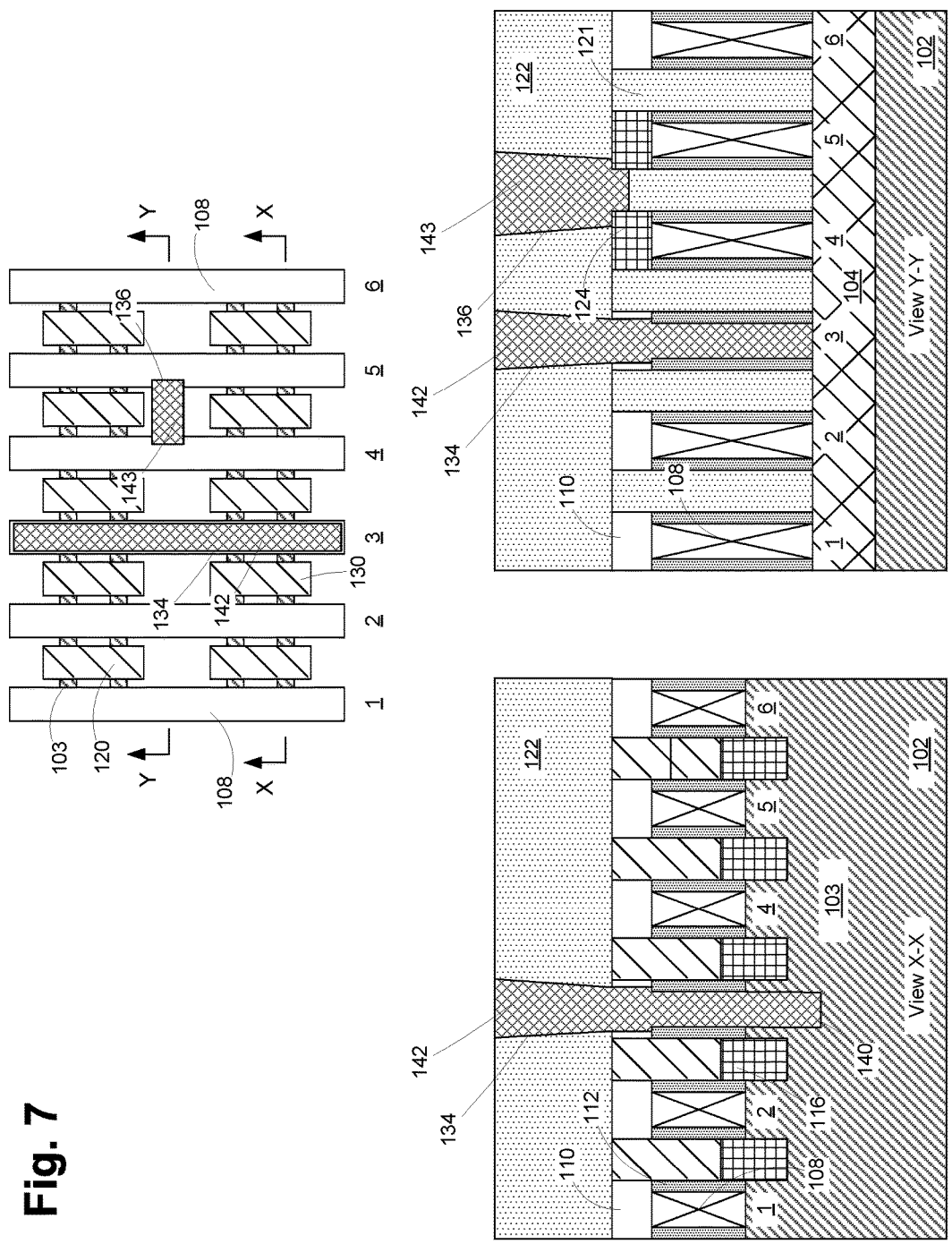

FIG. 7 depicts the product 100 after several process operations were performed. First, the etch mask 138 was removed. Thereafter, an insulating material, e.g., silicon nitride, SiNC, SiN, SiCO, and SiNOC, etc., or a combination of SiN and SiO2, etc., was deposited so as to over-fill the openings 134 and 136 and to substantially fill the trench 140. Next, a CMP or etch-back process was performed to remove excess amounts of the insulating material positioned above the upper surface of the layer of insulating material 122. These process operations result in the formation of an SDB isolation structure 142 in the trench 140 and the opening 134 and a gate contact etching post or pillar 143 in the opening 136. Note that the upper surfaces of the SDB isolation structure 142 and the gate contact etching post or pillar 143 are substantially level with the upper surface of the layer of insulating material 122.

Figure 8:
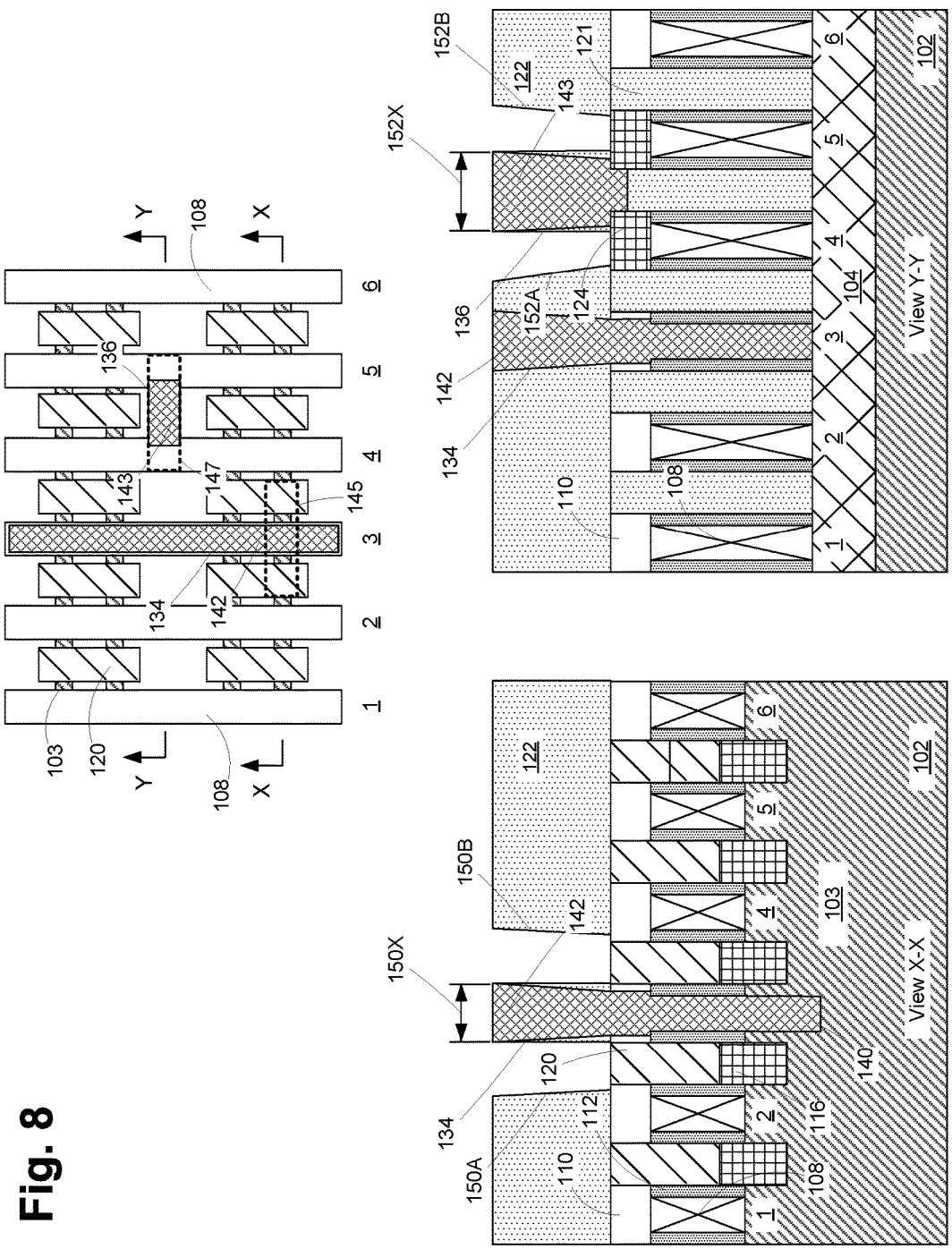

FIG. 8 depicts the product 100 after several process operations were performed. First, a patterned etch mask (not shown) was formed above the product 100. As shown in the plan view in FIG. 8, the patterned etch mask comprises a CA contact opening 145 and a CB contact opening 147. The CA contact opening 145 is positioned above portions of the source/drain contact structures 120 positioned on opposite sides of the SDB isolation structure 142 where CA contact structures 130 will be formed. The CA contact opening 145 also exposes a portion of the SBD isolation structure 142. The CB contact opening 147 is positioned above the lower gate contact structures 124 formed on the gates 4 and 5. The CB contact opening 147 also exposes the gate contact etching post or pillar 143. Next, one or more etching processes were performed though the patterned etch mask to remove the exposed portions of the insulating material 122 selectively to the SDB isolation structure 142 and the gate contact etching post or pillar 143. This etching process results in the formation of a plurality of CA source/drain contact openings 150A, 150B (see the view X-X; collectively referenced using the numeral 150) and a plurality of CB gate contact openings 152A, 152B (see the view Y-Y; collectively referenced using the numeral 152). The CA source/drain contact openings 150 expose underlying portions of the source/drain contact structures 120 positioned on opposite sides of the SDB isolation structure 142. The CB gate contact openings 152 expose portions of the lower gate contact structures 124 that are conductively coupled to the gate structures 108 of the gates 4 and 5. Thereafter, the patterned etch mask was removed. Note that, in some applications, the lower gate contact structures 124 may not be present. In such a situation, the CB gate contact openings 152 would expose portions of the conductive gate structures of the separate transistor devices.

Note that, due to the presence of the SDB isolation structure 142, one edge of the openings 150 is self-aligned with respect to the SDB isolation structure 142, i.e., the spacing 150X between the openings 150 is established by selective etching relative to the SDB isolation structure 142 and not by simply patterning the layer of insulating material 122. This technique for defining the spacing 150X provides greater process control as compared to trying to simply form corresponding type openings 150 in the layer of insulating material 122 by directly patterning the openings 150 using traditional masking and etching processes. Similarly, due to the presence of the gate contact etching post or pillar 143, one edge of the openings 152 is self-aligned with respect to the gate contact etching post or pillar 143, i.e., the spacing 152X between the openings 152 is established by selective etching relative to the gate contact etching post or pillar 143 and not by simply patterning the layer of insulating material 122. This technique for defining the spacing 152X provides greater process control as compared to trying to simply form corresponding type openings 152 in the layer of insulating material 122 by directly patterning the openings 152 using traditional masking and etching processes.

Figure 9:
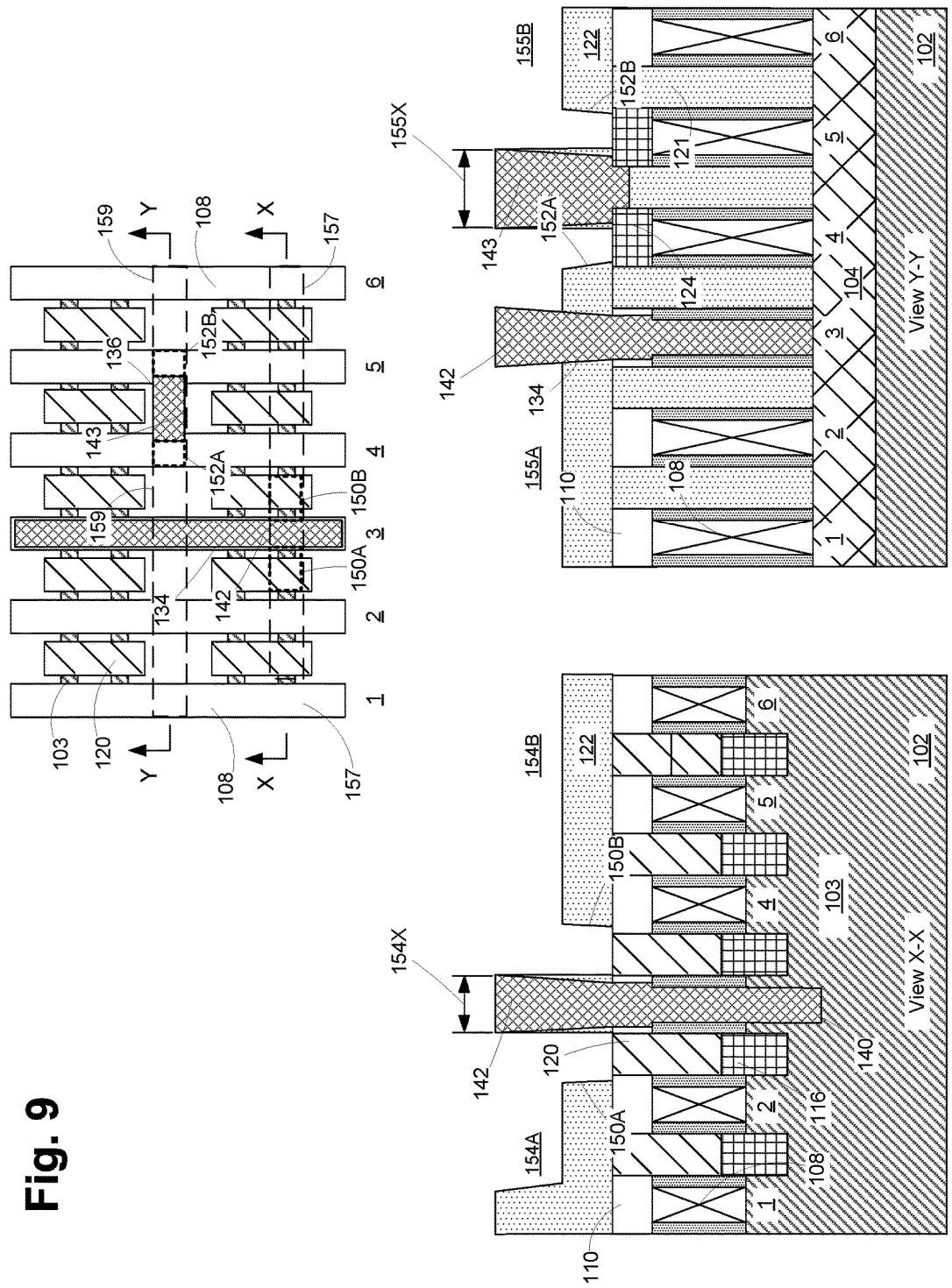

FIG. 9 depicts the product 100 after several process operation were performed. First, a patterned etch mask (not shown) was formed above the product so as to define a plurality of metal line trenches in the layer of insulating material 122. As shown in the plan view in FIG. 9, the patterned etch mask comprises a first rectangular-shaped opening 157 that is continuous at least for a distance where the opening 157 spans across the CA source/drain contact openings 150 positioned on opposite sides of the SDB isolation structure 142 (and perhaps the gates 2, 3 and 4) and a second continuous generally rectangular-shaped opening 159. In the depicted example, the opening 157 is positioned above the gates 2-6, above the CA source/drain contact openings 150 positioned on opposite sides of the SDB isolation structure 142 and exposes a portion of the SDB isolation structure 142. In the depicted example, the opening 159 is positioned above all of the gates 1-6, above the CB contact openings 152 and exposes the gate contact etching post or pillar 143. Next, one or more etching processes were performed though the patterned etch mask to remove the exposed portions of the insulating material 122 selectively to the SDB isolation structure 142 and the gate contact etching post or pillar 143. This etching process results in the formation of metal line trenches 154A and 154B (collectively referenced using the numeral 154) under the opening 157 on opposite sides of the SDB isolation structure 142, and the formation of metal line trenches 155A and 155B (collectively referenced using the numeral 155) under the opening 159 on opposite sides of the gate contact etching post or pillar 143. With reference to the view X-X, the metal line trench 154A is in communication with the CA source/drain contact opening 150A that exposes the underlying source/drain contact structure 120, while the metal line trench 154B is in communication with the CA source/drain contact opening 150B that exposes the underlying source/drain contact structure 120. Similarly, with reference to the view Y-Y, the metal line trench 155A is in communication with the CB gate contact opening 152A that exposes the underlying lower gate contact structure 124 on the gate 4, while the metal line trench 155B is in communication with the CB gate contact opening 152B that exposes the underlying lower gate contact structure 124 on the gate 5.

With continuing reference to FIG. 9, due to the presence of the SDB isolation structure 142, one edge of each of the trenches 154 is self-aligned with respect to the SDB isolation structure 142, i.e., the tip-to tip spacing 154X between the trenches 154A and 154B is established by selective etching relative to the SDB isolation structure 142 and not by simply patterning the corresponding trenches in the layer of insulating material 122. This technique for defining the spacing 154X provides greater process control as compared to trying to simply form corresponding separate trenches 154A, 154B in the layer of insulating material 122 by directly patterning separate trenches 154A, 154B using traditional masking and etching processes. Similarly, due to the presence of the gate contact etching post or pillar 143, one edge of each of the trenches 155 is self-aligned with respect to the gate contact etching post or pillar 143, i.e., the tip-to tip spacing 155X between the trenches 155A and 155B is established by selective etching relative to the gate contact etching post or pillar 143 and not by simply patterning the layer of insulating material 122. This technique for defining the spacing 155X provides greater process control as compared to trying to simply form corresponding separate trenches 155A, 155B in the layer of insulating material 122 by directly patterning separate trenches 155A, 155B using traditional masking and etching processes.

Figure 10:
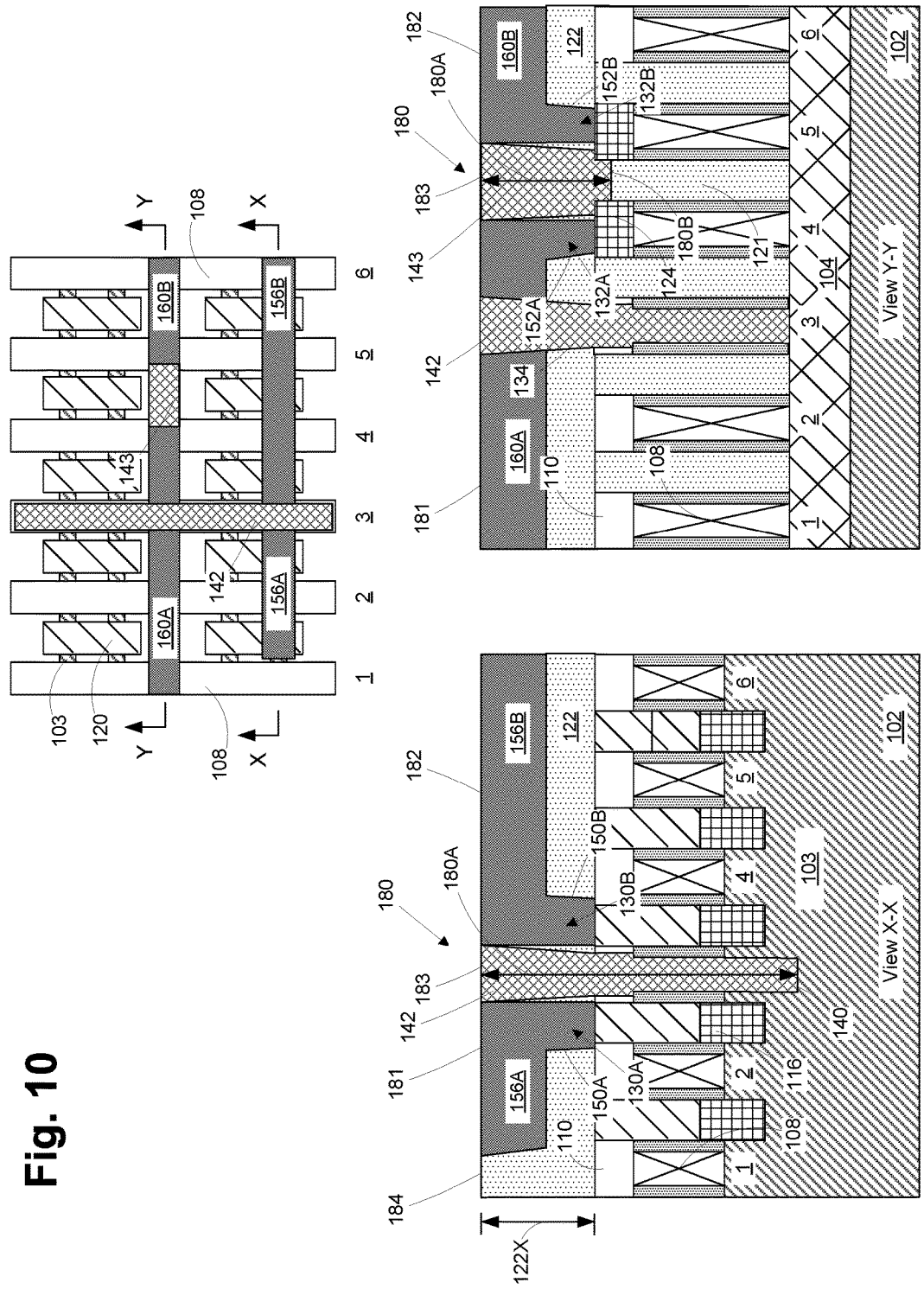

FIG. 10 depicts the product 100 after several process operations were performed to form the CA contacts 130, the CB contacts 132 and the metal lines 156, 160. First, one or more conformal barrier layers (not separately shown) were formed so as to line the openings 150, 152, 154 and 155 with the barrier material(s). Next, a layer of conductive material (e.g., copper, a metal-containing material, a metal compound, etc.) was then blanket-deposited on the product 100 so as to overfill the openings 150, 152, 154 and 155. At that point, a CMP process was performed to remove excess portions of the conductive materials from above the upper surfaces of the layer of insulating material 122, the SDB isolation structure 142 and the gate contact etching post or pillar 143. These process operations result in the formation of a CA contact 130A in the opening 150A, a CA contact 130B in the opening 150B, a CB contact 132A in the opening 152A and a CB contact 132B in the opening 152B. These process operations also result in the formation of a plurality of physically separate metal lines 156A, 156B, 160A and 160B that are formed by deposition and polishing—not by cutting previously formed continuous metal lines. The metal line 156A is conductively coupled to the CA contact 130A, the metal line 156B is conductively coupled to the CA contact 130B, the metal line 160A is conductively coupled to the CB contact 132A and the metal line 160B is conductively coupled to the CB contact 130B. Note that, in one illustrative embodiment, the upper surfaces of the metal lines 156 and 160 are substantially level or coplanar with the upper surfaces of the SDB isolation structure 142, the gate contact etching post or pillar 143 and the insulating material 122 positioned between the metal lines (the insulating material 122 is not shown in the cross-sectional views. Note that, in the IC products disclosed herein, the SDB isolation structure 142 is significantly taller than prior art SDB isolation structures. That is, the upper surface of the SDB structure 142 is located at a level that is significantly above the level of the upper surfaces of other structures, such as the gate caps 110, as compared to prior art products.

Figure 11:
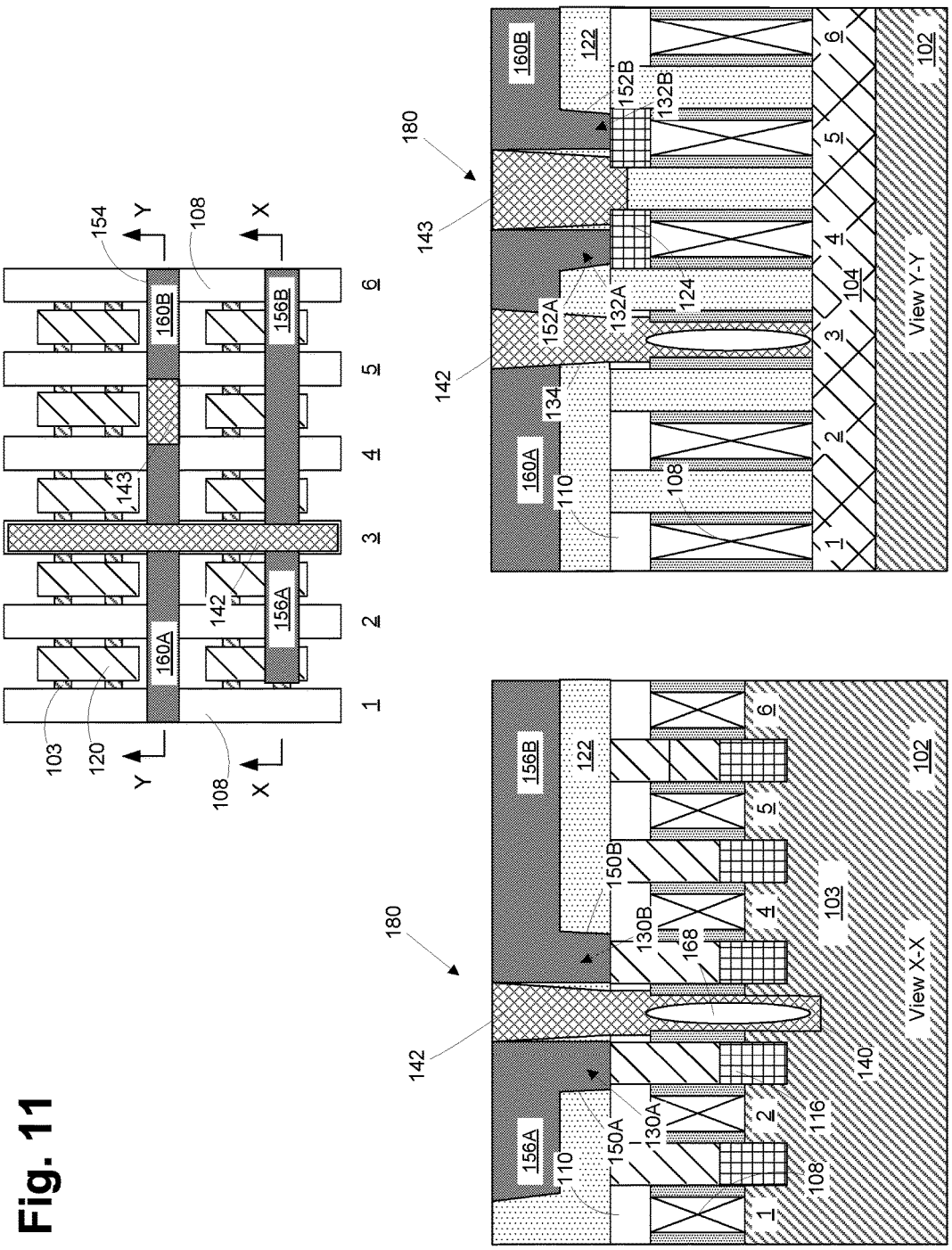
Figure 12:
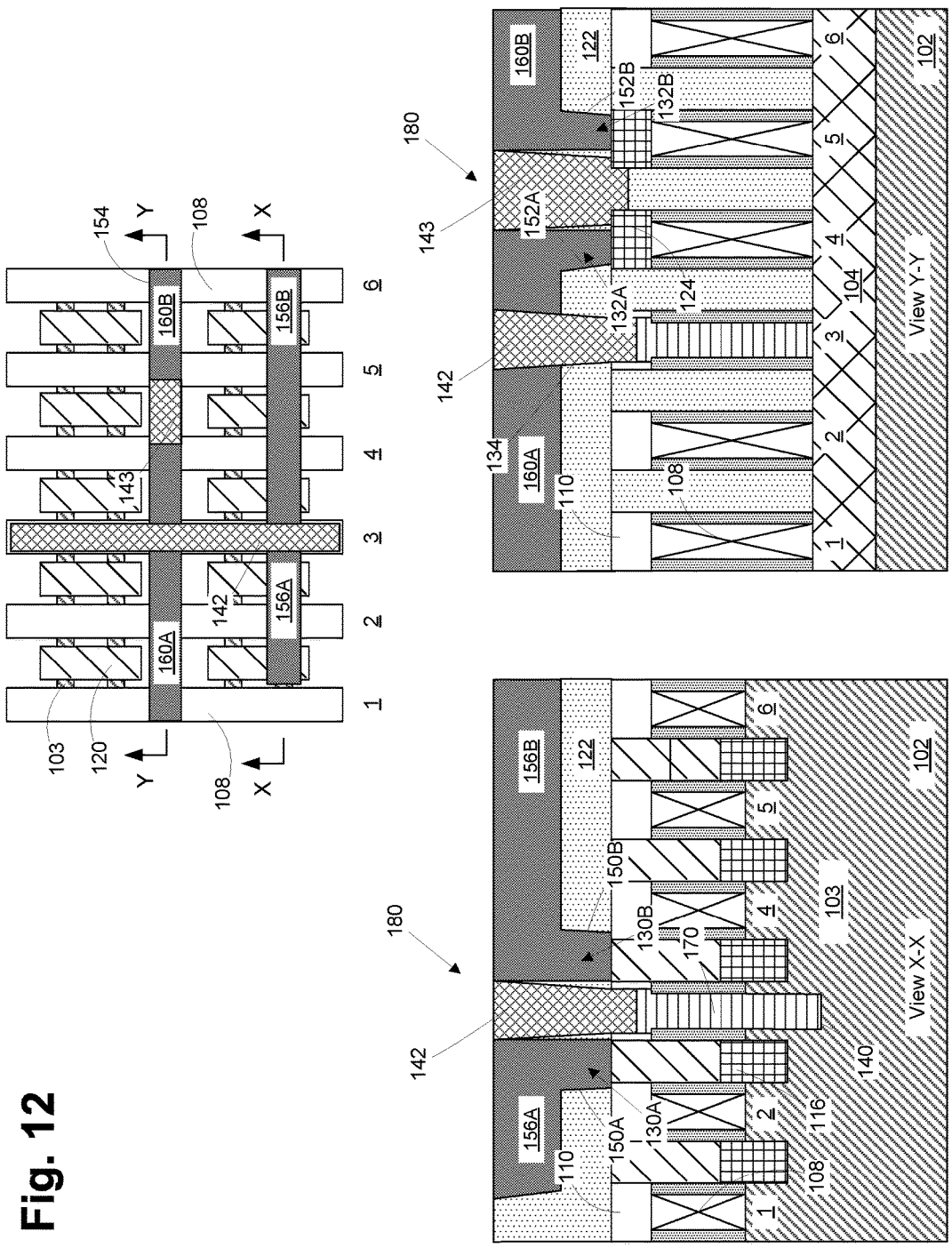

As will be appreciated by those skilled in the art after a complete reading of the present application, the methodologies disclosed herein provide additional options for device designers when fabricating integrated circuit products. For example, FIG. 11 depicts an embodiment wherein an air gap 168 was intentionally formed in the insulating materials that were deposited in the trench 140. The formation of such an air gap 168 may increase the effectiveness of the SDB structure 142 by effectively increasing its dielectric constant. The air gap 168 may be formed by controlling the deposition of the insulating material such that there is a "pinch off" within the trench 140 and does not completely fill the trench 140. FIG. 12 depicts another embodiment where the trench 140 and the opening thereabove may be filled with different insulating materials. For example, the lower portion of the trench 140 may be filled with a relatively lower-k material 170 (e.g., a material having a k value of 3.3 or less) as compared to the k value of the materials used for the upper portion of the SDB isolation structure 142.

As will be appreciated by those skilled in the art after a complete reading of the present application, the SDB structure 142 and the gate contact etching post 143 constitute just two examples of a novel contact etching structure 180 disclosed herein that may be used to form conductive contact structures in a variety of situations other than the illustrative examples disclosed and discussed herein. For example, in one embodiment, a method disclosed herein may include forming first and second lower conductive structure (such as the source/drain contact structures 120 or the lower gate contact structures 124 (if present)), and forming a layer of insulating material (e.g., the layer 122) made of a first material above the first and second lower conductive structures. Thereafter, the method may include forming the contact etching structure 180 in the layer of insulating material, wherein the contact etching structure 180 is made of a second material that is different than the first material. Also note that at least a portion of the contact etching structure 180 is positioned laterally between at least a portion of the first lower conductive structure and at least a portion of the second lower conductive structure. In the case where the contact etching structure 180 is the SDB structure 142, the contact etching structure 180 may be positioned between the entirety of the source/drain contact structures 120 (in both the vertical direction and in the gate width direction of the devices). The method may also include forming a first conductive line and a first conductive contact adjacent a first side of the contact etching structure 180, wherein the first conductive contact is conductively coupled to the first lower conductive structure. In the case where the contact etching structure 180 is the SDB structure 142, the first conductive contact may be a CA contact that is conductively coupled to one of the source/drain contact structures 120. In the case where the contact etching structure 180 is the gate contact etching post 143, the first conductive contact may be a CB gate contact that is conductively coupled to one of the lower gate contact structures 124 (or a gate structure). The method may also include forming a second conductive line and a second conductive contact adjacent a second side of the contact etching structure, the second side of the contact etching structure being opposite the first side of the contact etching structure, wherein the second conductive contact is conductively coupled to the second lower conductive structure and wherein a spacing between the first and second conductive lines is approximately equal to a dimension of the contact etching structure 180.

With reference to FIG. 10, the novel contact etching structure 180 presents several novel structures as well. For example, in at least some applications, at least a portion of the first conductive line (e.g., line 156A or 160A) may be positioned on and in contact with the first side of the contact etching structure 180, while at least a portion of the second conductive line (e.g., line 156B or 160B) is positioned on and in contact with the second side of the contact etching structure 180. Also note that the contact etching structure 180 may have a vertical height 180A that is different depending upon the particular application. In one example, the vertical height 180A may be greater than the thickness 122X of the layer of insulating material 122. It should also be noted that, in some cases, the first conductive line, the second conductive line and the contact etching structure 180 may be formed such that an upper surface 181 of the first conductive line, an upper surface 182 of the second conductive line and an upper surface 183 of the contact etching structure 180 are all positioned at approximately a same first level above a semiconductor substrate. In even other situations, an upper surface 184 of the layer of insulating material 122 is positioned at the first level. As depicted in the view X-X, in some applications, the contact etching structure 180 may extend into a trench 140 formed in a semiconductor substrate 102. With reference to the view Y-Y, in some applications, a portion of the contact etching structure 180 may be positioned on and in contact with a surface of each of the first and second lower conductive structures (e.g., the lower gate contact structures 124). Still referencing the view Y-Y, in other applications, a bottom surface 180B of the contact etching structure 180 may be positioned on and in contact with a layer of insulating material 121 that is positioned between the first and second lower conductive structures. Of course, after a complete review of the present application, those skilled in the art will appreciate that there are more unique structures and methods disclosed herein other than those mentioned immediately above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming first and second lower conductive structures;
    forming a layer of insulating material comprising a first material above said first and second lower conductive structures;
    forming a contact etching structure in said layer of insulating material, wherein said contact etching structure comprises a second material that is different than said first material and wherein at least a portion of said contact etching structure is positioned laterally between at least a portion of said first lower conductive structure and at least a portion of said second lower conductive structure;
    forming a first conductive line and a first conductive contact adjacent a first side of said contact etching structure, wherein said first conductive contact is conductively coupled to said first lower conductive structure; and
    forming a second conductive line and a second conductive contact adjacent a second side of said contact etching structure, said second side of said contact etching structure being opposite said first side of said contact etching structure, wherein said second conductive contact is conductively coupled to said second lower conductive structure and wherein a spacing between said first and second conductive lines is approximately equal to a dimension of said contact etching structure.

2. The method of claim 1, wherein at least a portion of said first conductive line is positioned on and in contact with said first side of said contact etching structure and at least a portion of said second conductive line is positioned on and in contact with said second side of said contact etching structure.

3. The method of claim 1, wherein said contact etching structure has a vertical height that is greater than a thickness of said layer of insulating material.

4. The method of claim 1, wherein an edge of said first conductive line and an edge of said second conductive line are each self-aligned with respect to said contact etching structure.

5. The method of claim 1, wherein said first conductive line, said second conductive line and said contact etching structure are formed such that an upper surface of said first conductive line, an upper surface of said second conductive line and an upper surface of said contact etching structure are all positioned at approximately a same first level above a semiconductor substrate.

6. The method of claim 5, wherein said layer of insulating material has an upper surface that is positioned at said first level.

7. The method of claim 1, wherein a portion of said contact etching structure extends into a trench formed in a semiconductor substrate.

8. The method of claim 1, wherein said contact etching structure is positioned between an entirety of said first lower conductive structure and an entirety of said second lower conductive structure.

9. The method of claim 1, wherein said contact etching structure is a single diffusion break (SDB) structure that is formed through a first gate of an integrated circuit product, said first conductive contact is a first source/drain contact that is conductively coupled to a first source/drain region positioned adjacent a first side of said SDB structure, and said second conductive contact is a second source/drain contact that is conductively coupled to a second source/drain region positioned adjacent a second side of said SDB structure.

10. The method of claim 9, wherein said first source/drain region is for a first transistor and said second source/drain region is for a second transistor that is different from said first transistor.

11. The method of claim 1, wherein a portion of said contact etching structure is positioned on and in contact with a surface of each of said first and second lower conductive structures.

12. The method of claim 1, wherein a bottom surface of said contact etching structure is positioned on and in contact with a second layer of insulating material that is positioned between said first and second lower conductive structures.

13. The method of claim 1, wherein said contact etching structure is a gate contact etching post, said first conductive contact is a first gate contact that is conductively coupled to a first lower gate contact structure of a gate structure of a first gate, and said second conductive contact is a second gate contact that is conductively coupled to a second lower gate contact structure of a gate structure of a second gate.

14. A method, comprising:
    forming a single diffusion break (SDB) structure through a first gate of an integrated circuit product; and
    forming a first conductive line and a first conductive source/drain contact on a first side of said SDB structure and a second conductive line and a second conductive source/drain contact on a second side of said SDB structure, said second side being opposite said first side, wherein said first conductive source/drain contact is conductively coupled to a first source/drain region positioned on said first side of said SDB structure and said second conductive source/drain contact is conductively coupled to a second source/drain region positioned on said second side of said SDB structure, wherein a tip-to-tip spacing between said first and second conductive lines is approximately equal to a dimension of said SDB structure.

15. The method of claim 14, wherein an edge of said first conductive line and an edge of said second conductive line are each self-aligned with respect to said SDB structure.

16. The method of claim 14, wherein said first conductive line, said second conductive line and said SDB structure are formed such that an upper surface of said first conductive line, an upper surface of said second conductive line and an upper surface of said SDB structure are all positioned at approximately a same first level above a semiconductor substrate.

17. The method of claim 16, wherein the method further comprises forming a layer of insulating material above said semiconductor substrate, wherein said layer of insulating material has an upper surface that is positioned at said first level.

18. The method of claim 16, wherein a portion of said SDB structure extends into a trench formed in said semiconductor substrate.

19. The method of claim 18, wherein said SDB structure comprises a first material and said layer of insulating material comprises a second material that is different than said first material.

20. The method of claim 14, wherein the method further comprises:
   forming a first and a second lower gate contact structure to a gate structure of each of second and third gates, respectively;
   forming a layer of insulating material above said second and third gates;
   forming a gate contact etching post in said layer of insulating material; and
   forming a third conductive line and a first gate contact on a first side of said gate contact etching post and a fourth conductive line and a second gate contact on a second side of said gate contact etching post, said second side of said gate contact etching post being opposite said first side of said gate contact etching post, wherein said first gate contact is conductively coupled to said first lower gate contact structure positioned on said first side of said gate contact etching post and said second gate contact is conductively coupled to said second lower gate contact structure positioned on said second side of said gate contact etching post, wherein a tip-to-tip spacing between said third and fourth conductive lines is approximately equal to a dimension of said gate contact etching post.

* * * * *